United States Patent
Zha

(10) Patent No.: US 10,726,772 B2
(45) Date of Patent: Jul. 28, 2020

(54) DISPLAY DEVICE, BACKLIGHT MODULE AND MANUFACTURING METHOD THEREOF

(71) Applicant: Wuhan China Star Optoelectronics Technology Co., Ltd., Wuhan (CN)

(72) Inventor: Guowei Zha, Shenzhen (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 16/172,846

(22) Filed: Oct. 28, 2018

(65) Prior Publication Data

US 2019/0371230 A1 Dec. 5, 2019

Related U.S. Application Data

(63) Continuation of application No. PCT/CN2018/097410, filed on Jul. 27, 2018.

(30) Foreign Application Priority Data

May 29, 2018 (CN) .......................... 2018 1 0532486

(51) Int. Cl.
*G09G 3/32* (2016.01)
*G02B 5/02* (2006.01)

(52) U.S. Cl.
CPC ............. *G09G 3/32* (2013.01); *G02B 5/0205* (2013.01)

(58) Field of Classification Search
None
See application file for complete search history.

(56) References Cited

FOREIGN PATENT DOCUMENTS

| CN | 101162318 A | * | 4/2008 |
|---|---|---|---|
| CN | 101162318 A | | 4/2008 |
| CN | 101639181 A | | 2/2010 |
| CN | 105206642 A | | 12/2015 |
| CN | 105226167 A | | 1/2016 |
| CN | 206497275 U | | 9/2017 |
| CN | 107799510 A | | 3/2018 |

* cited by examiner

*Primary Examiner* — Kenneth B Lee, Jr.

(57) ABSTRACT

A display device, a backlight module and a manufacturing method of a backlight module are provided. The backlight module may include a substrate, a backlight source arranged on the substrate, and a silicone film coated on a light emitting surface of the backlight source. A cross-section of the silicone film along a direction substantially perpendicular to the substrate is an arc to diffuse light emitted by the backlight source. By coating the surface of the backlight source with an arc silicone film, the light angle of the backlight source could be increased, so as to achieve the goal of mixing light with a smaller mixing light distance, which could reduce the thickness of backlight module.

13 Claims, 5 Drawing Sheets

DISPLAY DEVICE, BACKLIGHT MODULE AND MANUFACTURING METHOD THEREOF

CROSS-REFERENCE TO RELATED APPLICATIONS

The present application is a continuation-application of International (PCT) Patent Application No. PCT/CN2018/097410, field on Jul. 27, 2018, which claims foreign priority of Chinese Patent Application No. 201810532486.1, field on May 29, 2018 in the State Intellectual Property Office of China, the entire contents of which are hereby incorporated by reference.

TECHNICAL FIELD

The described embodiments relate to display technology, and in particular to a display device, a backlight module and a manufacturing method of a backlight module.

BACKGROUND

With the gradual rise of wearable applications such as smart glasses and smart watches, the demand for flexible display devices in the display industry is also increasing. Organic Light Emitting Display device (OLED) has the characteristics of no backlight, thin thickness, wide Angle of view and fast reaction speed, etc., so it has the natural advantage of flexible Display. Facing the competition of flexible OLED, the traditional liquid crystal display technology also gradually uses flexible substrate to break through in flexibility, curved surface, etc., thus it can be seen that the era of flexible and curved surface display is coming.

Referring to FIGS. 1 and 2. FIG. 1 is a schematic view of the plane structure of the display device in a related art. FIG. 2 is a cross-sectional view of the display device in FIG. 1. Combining FIG. 1 and FIG. 2, in the related art, display device 10 includes a display area 12 and a lower border 11. A drive component 111, a backlight 112 and a mixed light area 113 are arranged on the lower border 11. The width of lower border 11 is L1, and the width of mixed light area 113 is L2. At present, the upper, left and right border of display device 10 are compressed to be small so as to meet the current demand of the full screen. However, further compressing the lower border 111 has become an urgent technical problem to be solved due to the existence of the drive component 111, backlight 112 and mixed light area 113. Display device 10 adopts side-entry light, since the back light 112, as a point source, has certain thickness itself, it is necessary to spread the light evenly through the astigmatism of the light guide plate to avoid the low beam hotspot phenomenon (ie, the yin and yang stripes appear on the display screen), and a certain mixing light distance L2 is needed. When the width of bottom border 111, L1, is decreased, the compression of mixing light distance L2 is usually accompanied by a sharp decrease in backlight efficiency, which makes the lower border of the backlight of the existing center size liquid crystal module have a certain limit (about 2 mm).

In other words, in related art, the mix light distance limits the width of the lower border and limits the development of the full screen.

SUMMARY

The main technical problem solved by the present disclosure is to provide a display device, a backlight module and a manufacturing method of a backlight module, so as to enable backlight source to achieve the mixing effect with a smaller mixing distance.

In order to solve the technical problem, the present disclosure provides a backlight module, the backlight module may include a substrate, a backlight source arranged on the substrate, and a silicone film coated on a light emitting surface of the backlight source, a cross-section of the silicone film along a direction substantially perpendicular to the substrate may be an arc to diffuse light emitted by the backlight source.

In order to solve the technical problem, the present disclosure further provides display device, the display device may include a backlight module, the backlight module may include a substrate, a backlight source arranged on the substrate, and a silicone film coated on a light emitting surface of the backlight source, a cross-section of the silicone film along a direction substantially perpendicular to the substrate may be an arc to diffuse light emitted by the backlight source.

In order to solve the technical problem, the present disclosure further provides manufacturing method of a backlight module, the method may include: providing a substrate; arranging a backlight source on a side of the substrate; and forming a silicone film on a light emitting surface of the backlight source, wherein a cross-section of the silicone film along a direction substantially perpendicular to the substrate may be an arc to diffuse light emitted by the backlight source.

The backlight module of the present disclosure may include the substrate, the backlight source arranged on the substrate, and the silicone film coated on a light emitting surface of the backlight source, a cross-section of the silicone film along a direction substantially perpendicular to the substrate is an arc to diffuse light emitted by the backlight source. By coating the surface of the backlight source with an arc silicone film, the light angle of the backlight source could be increased, so as to achieve the goal of mixing light with a smaller mixing light distance, which could reduce the thickness of backlight module.

DETAILED DESCRIPTION

The technical solution of the embodiments of the present disclosure will be described more clearly and completely with reference to the accompanying drawings. Apparently, the embodiments described here only some exemplary embodiments, not all the embodiments. Based on the embodiments described in the present disclosure, one skilled in the art may acquire all other embodiments without any creative work. All these shall be covered within the protection scope of the present disclosure.

An embodiment of the present disclosure provides a backlight module, including a substrate, a backlight source arranged on the substrate, and a silicone film coated on a light emitting surface of the backlight source. A cross-section of the silicone film along a direction substantially perpendicular to the substrate may be an arc to diffuse light emitted by the backlight source.

Figure 1:
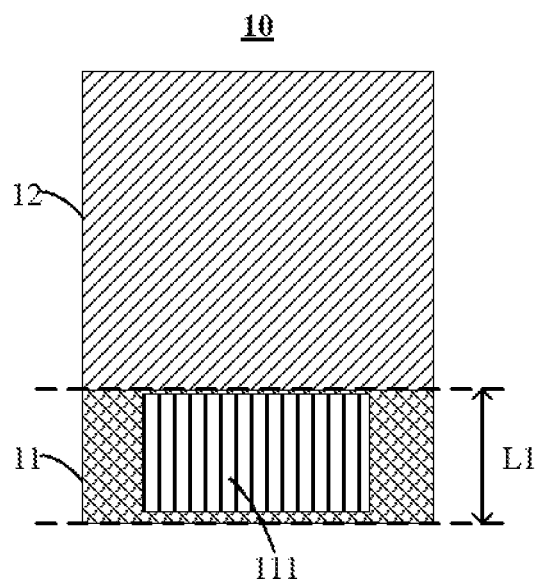
FIG. 1 is a schematic view of the plane structure of the display device in a related art.
Figure 2:
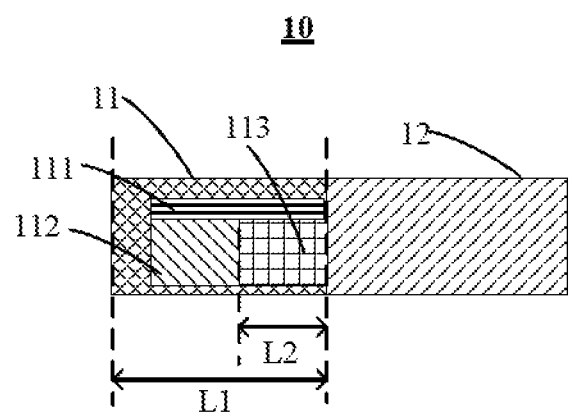
FIG. 2 is a cross-sectional view of the display device in FIG. 1.
Figure 3:
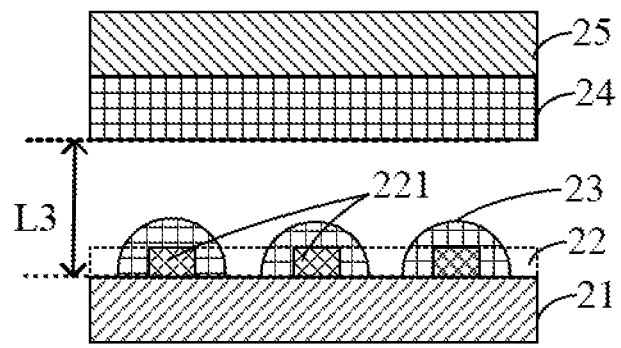
FIG. 3 is a cross-sectional view of a backlight module according to an embodiment of the present disclosure.

In order to describe the specific structure of the backlight module above, referring to FIG. 3, a cross-sectional view of a backlight module according to an embodiment of the present disclosure is depicted.

In this embodiment, the backlight module 20 may include a substrate 21, a backlight source 22 arranged on the substrate 21, and a silicone film 23 coated on a light emitting surface of backlight source 22. A cross-section of the silicone film 23 along a direction substantially perpendicular to the substrate 21 may be an arc, so as to diffuse the light emitted by the backlight source 22.

In this embodiment, the substrate 21 may be Flexible Printed Circuit board (FPC). The FPC may have a base material of polyimide or polyester film, which may have high reliability and excellent flexibility, and have characteristics of high density light weight, thin thickness and good bending. The substrate 21 may control the backlight source 22 to provide backlight for the display device. In other embodiments, the substrate 21 may also be other types of circuit boards, which are not limited herein.

In the embodiment, the backlight module 20 may also include a diffusion film 24 and brightness enhancement film 25. The diffusion film 24 may be located on a side of the silicone film 23 away from the backlight source 22, and may be spaced apart from the silicone film 23. The light emitted by backlight source 22 may be mixed before reaching the diffusion film 24, and the mixing light distance may be L3. A base material of the diffusion film 24 may be Polyethylene terephthalate (PET), both sides of the PET may be coated with optics astigmatism particles. In other embodiments, the diffusion film 23 can also be made of other materials, which is not limited herein. When the light passes through the diffusion film 24, the light will pass through two media with different refractive indices. Therefore, much phenomenon of refraction, reflection and scattering will occur to the light, resulting in the effect of optical diffusion, which makes the light be emitted evenly, and finally make the light be spread out softly and evenly. The brightness enhancement film 25 may be arranged on a side of diffusion film 24 far from the silicone film 23, and may be adjacent to the diffusion film 24. The brightness enhancement film 25 could improve the luminous efficiency of the whole backlight system.

In this embodiment, the backlight source 22 may include a plurality of LED lights 221 distributed in array, and a light emitting surface of each of the plurality of LED lights 221 may be coated with the silicone film 23 with a curved surface. The silicone film 23 may be a silicon layer containing fluorescent powder or quantum dots. In an embodiment, the silicone film 23 may be formed by mixing red phosphors, green phosphors, blue phosphors and silicone gel. When the light of the LED lights 221 passes through the silicone film 23, since the surface of silicone film 23 is a curved surface, light angle of the light emitted from silicone film 23 may be increased, and the light shape could be opened, such that the mixing light effect can be achieved with a smaller mixing light distance L3. The thickness of backlight module 20 may be reduced because the reduction of the mixing light distances L3. In other embodiments, the silicone film 23 may also be other transparent layers containing fluorescent powder or quantum dots, which is not limited herein.

Figure 4:
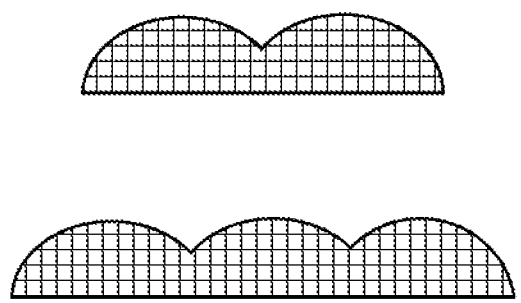
FIG. 4 is a cross-sectional view of a silicone film in FIG. 3 according to another embodiment of the present disclosure.

Furthermore, in this embodiment, the cross-section of the silicone film 23 along the direction substantially perpendicular to the substrate 21 may be an arc. In other embodiments, the cross-section of the silicone film 23 along the direction substantially perpendicular to the substrate 21 may also be a double arc curve or a multi-arc curve, as shown in FIG. 4, a cross-sectional view of a silicone film in FIG. 3 according to another embodiment of the present disclosure is depicted.

Figure 5:
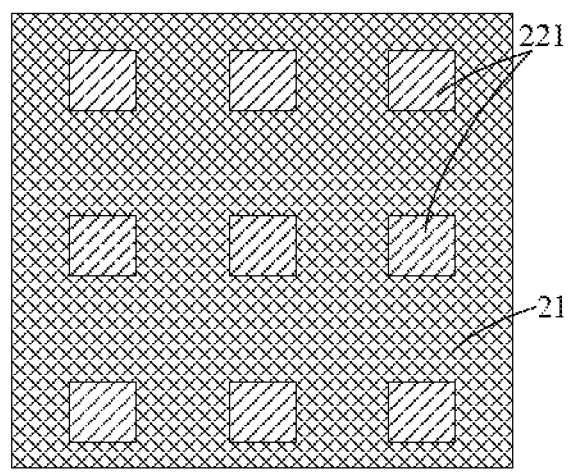
FIG. 5 is a schematic view of an arrangement of LED on the substrate in FIG. 3.

Further, referring to FIG. 5, a schematic view of an arrangement of LED on the substrate in FIG. 3 is depicted. As shown in FIG. 5, the LED lights 221 may be blue LED lights, and the blue light emitted by the blue LED lights will be irradiated on the silicone film 23 mixed according to a preset proportion, such that a preset light could be emitted. The LED lights 221 may be mini LED (submillimeter light emitting diode) lights. The length and width of each of the LED light 221 may be 100~1000 mm, and the spacing between adjacent LED lights 221 may be 100~2000 mm. In other embodiments, the size, arrangement and luminous color of the LED lights can be determined to the actual situation. For example, the LED lights may be red LED lights, it only needs to change the proportion of phosphor powder of the silicone film 23, which is not limited herein. Since the light is diffused by the silicone film 23, the spacing between each two LED lights 221 can be increased in a certain range without occurring the phenomenon of hotspot. Therefore, the number of LED lights 221 could be reduced, and the production cost could also be reduced.

Furthermore, the silicone film 23 may be formed by steel mesh mask. Specifically, liquid silicone may be coated on the LED lights 221 distributed in array through the steel mesh mask, and the liquid silicone may be shaped by heating and cured by cooling to form the silicone film 23 to cover the LED lights 221.

Figure 6:
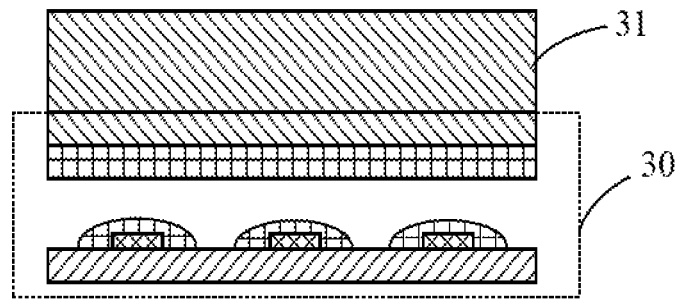
FIG. 6 is a cross-sectional view of a display device according to an embodiment of the present disclosure.

Referring to FIG. 6, a cross-sectional view of a display device according to an embodiment of the present disclosure is depicted. As shown in FIG. 6, a display device 3 may include a backlight module 30 and display module 31. The backlight module 30 may be the same as that in FIG. 3, which is not recited herein. Backlight module 31 may be arranged on the back of display module 31. Circuit board and backlight source in the display device of the related art adopting side-entry light are arranged on the lower border of the display panel. The width of the lower border may be limited, as a result, the lower border cannot be very narrow. In addition, the substrate 21 and backlight source 22 of the present disclosure are arranged at the back of the display panel, which are vertical downward backlight, no backlight source is arranged on the lower border, and the lower border may be not limited by the mixing light distance. The width of the lower border can be compressed to substantially the same as the top, left and right borders to achieve a full screen. In addition, since the mixing light distance is reduced, the thickness of backlight module 30 is reduced, the thickness of display device 3 was reduced. In other embodiments, the backlight can also be the side-entry light. The scheme of reducing the mixing light distance in the present embodiment could also be used to reduce the mixing light distance of a backlight of side-entry light, so as to reduce the width of the lower border.

Figure 7:
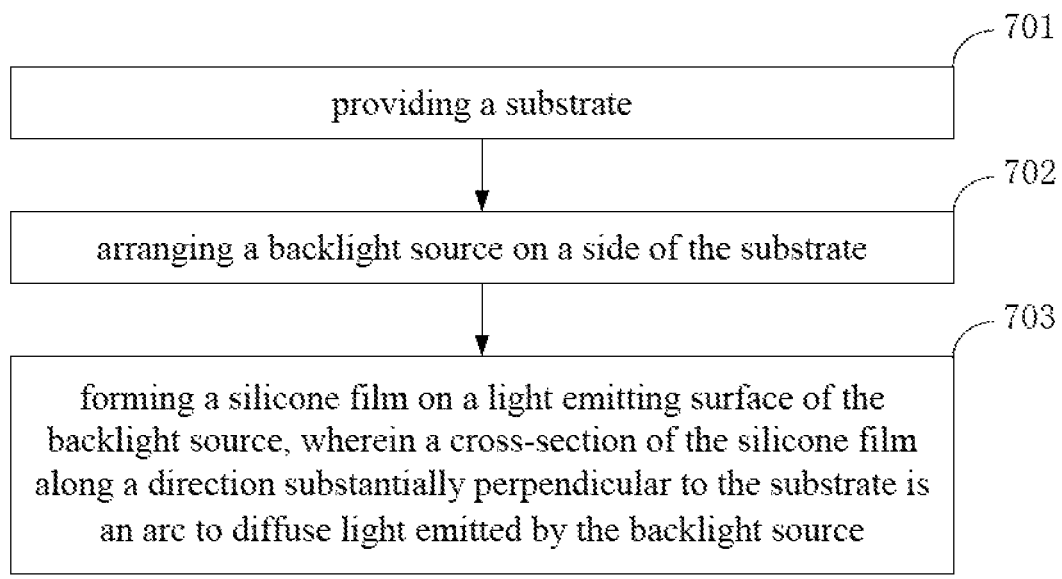
FIG. 7 is a flow chart diagram of a method of manufacturing the backlight module according to an embodiment of the present disclosure.

Referring to FIG. 7, a flow chart diagram of a method of manufacturing the backlight module according to an embodiment of the present disclosure is depicted.

As shown in FIG. 7, the manufacturing method of a backlight module in an embodiment may include:

Block 701: providing a substrate.

Figure 8A:
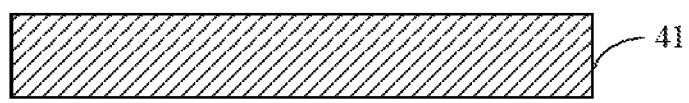
FIG. 8a is a cross-sectional view of the backlight module in block 701 in FIG. 7.

Referring to FIG. 8a, a cross-sectional view of the backlight module in block 701 in FIG. 7 is depicted. In this embodiment, the substrate 41 may be a Flexible Printed Circuit board (FPC). The FPC may have a base material of polyimide or polyester film, which may have high reliability and excellent flexibility and have characteristics of high density, light weight, thin thickness and good bending. The substrate 41 may control the backlight to provide backlight to the display device. In other embodiments, the substrate 41 can be other types of circuit boards, which is not limited herein.

Block 702: arranging a backlight source on a side of the substrate.

Figure 8B:
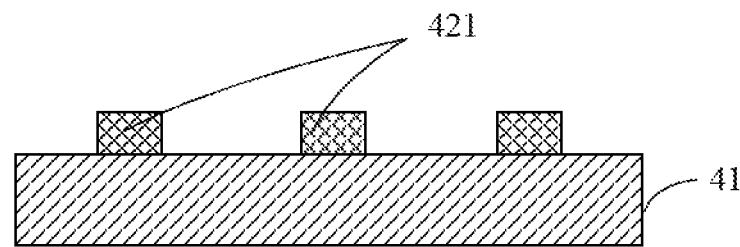
FIG. 8b is a cross-sectional view of the backlight module in block 702 in FIG. 7.

Referring to FIG. 8b, a cross-sectional view of the backlight module in block 702 in FIG. 7 is depicted. As shown in 8b, a plurality of LED lights 421 may be arranged on the substrate 41 and distributed in array. In the embodiment, the arrangement of the plurality of LED lights 421 may be similar to that in FIG. 5, which may not be described herein. Each of the LED lights 221 may be a blue LED, and further be a mini LED light (submillimeter LED). The length and width of each of the LED lights 421 may be about 100~1000 mm, and the spacing between the adjacent LED lights 421 may be about 100~2000 mm.

Block 703: forming a silicone film on a light emitting surface of the backlight source, wherein a cross-section of the silicone film along a direction substantially perpendicular to the substrate is an arc to diffuse light emitted by the backlight source.

Figure 8C:
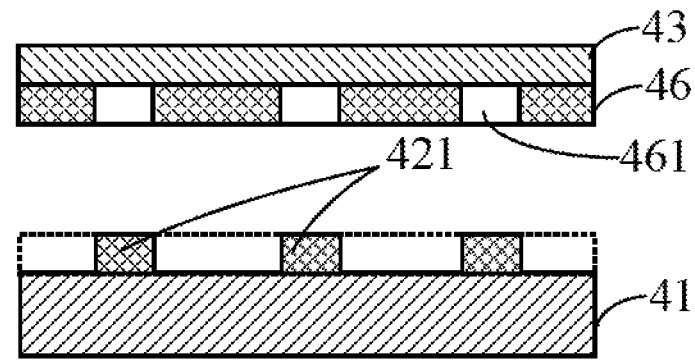
FIG. 8c is a cross-sectional view of the backlight module when silicone film is coated in block 703 in FIG. 7.
Figure 8D:
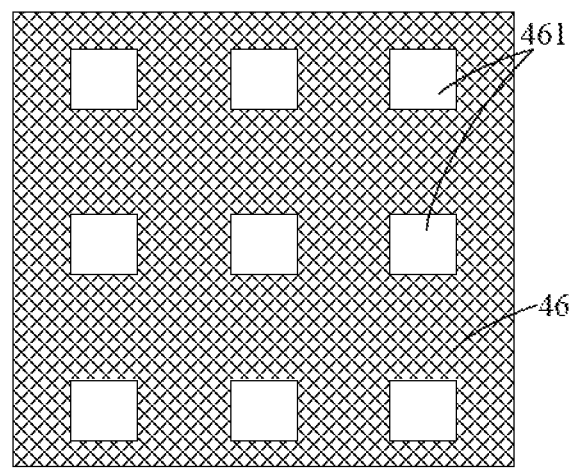
FIG. 8d is a plane view of steel mesh mask in block 703 in FIG. 7.
Figure 8E:
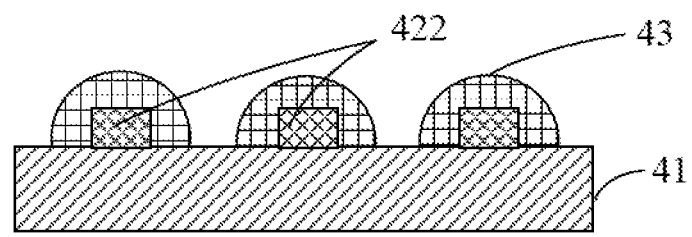
FIG. 8e is a cross-sectional view of backlight module after the silicone film is cured in block 703 in FIG. 7.

Please refer to FIGS. 8c, 8d and 8e. Fig. FIG. 8c is a cross-sectional view of the backlight module when silicone film is coated in block 703 in FIG. 7, FIG. 8d is a plane view of steel mesh mask in block 703 in FIG. 7, and FIG. 5e is a cross-sectional view of backlight module after the silicone film is cured in block 703 in FIG. 7.

In this embodiment, the steel mesh mask 46 may be an array of micron-sized pore structures. The steel mesh mask 46 may include a plurality of through-holes 461 distributed in array, and the structural centers of the plurality of the through-holes 461 may have a one-on-one correspondence with the structural centers of the plurality of LED lights 421. An area of each through-hole 461 may be greater than an area of each LED light 421, and the length and width of each through-hole 461 may be about 100-1500 μm.

In a specific embodiment, the LED light 421 may have a configuration of square, side length of which may be 150 μm. The through hole 461 may also have a configuration of square, side length may be 160 μm. The size of the LED light 421 may be slightly smaller than that of the through hole 461, and the centroid of each LED light 421 may correspond to the centroid of each through hole 461.

In an embodiment, liquid silicone may be coated or printed in the centroid of each of the through holes 461 firstly, after aligning centers of the plurality of through holes 461 with centers of the plurality of LED lights by positioning marks. Then the the steel mesh mask may be removed, the liquid silicone may be shaped by heating and cured by cooling to form the silicone film 43, such that the silicone film 43 may coat the LED lights. A cross-section of the silicone film 43 along a direction substantially perpendicular to the substrate 41 may be an arc. Since liquid silicone in the present disclosure is covered to each of the plurality of the LED lights through the through holes 461, whose centers are aligned with the centers of the plurality of LED lights, the silicone film 43 could mate with the plurality of LED lights accurately, thereby improving the accuracy of sample preparation.

In an embodiment, mixing red phosphor, green phosphor, blue phosphor powder and silicone according to the preset proportion to form silicone film 43. After aligning centers of the plurality of through holes 461 with centers of the plurality of LED lights by positioning marks, coating or printing liquid silicone in the plurality of through holes 461. Finally, removing the steel mesh mask, heating the liquid silicone, such that the liquid silicone may form a droplet shape by the tension of the liquid itself and coat the LED light 421, and that a cross-section of the silicone film 43 along a direction substantially perpendicular to the substrate 41 may be an arc. In other embodiments, the silicone film 43 may be molded in other ways, so as to form a silicone film 42 having a cross-section along the direction substantially perpendicular to the substrate 41 may be a double arc curve or a multi-arc curve.

Figure 8F:
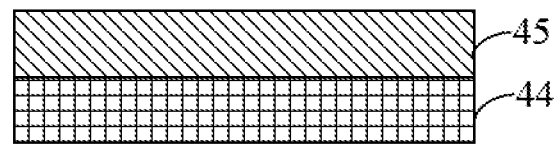
FIG. 8f is a cross-sectional view of the backlight module after block 703 in FIG. 7.
Figure 8F:
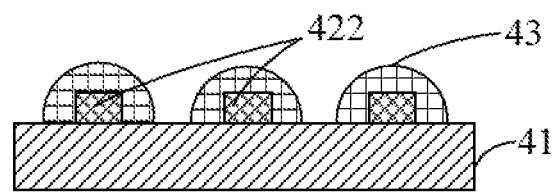

Furthermore, please referring to FIG. 8f, a cross-sectional view of the backlight module after block 703 in FIG. 7 is depicted. As shown in FIG. 8f, after the silicone film 43 is cured, the diffusion film 44 and the brightness enhancement film 45 may be successively prepared so as to form the backlight module. The diffusion film 44 and the brightness enhancement film 45 may be similar to the diffusion film 24 and the brightness enhancement film 25 shown in FIG. 3, which is not recited herein.

Different from the related art, this present disclosure has the following advantages: (1) The backlight module of the present disclosure may include the substrate, the backlight source arranged on the substrate, and the silicone film coated on a light emitting surface of the backlight source, a cross-section of the silicone film along a direction substantially perpendicular to the substrate is an arc to diffuse light emitted by the backlight source. By coating the surface of the backlight source with an arc silicone film, the light angle of the backlight source could be increased, so as to achieve the goal of mixing light with a smaller mixing light distance, which could reduce the thickness of backlight module. (2) Since liquid silicone of the present disclosure is covered to each of the plurality of the LED lights through the through holes 461, whose centers are aligned with the centers of the plurality of LED lights, the silicone film 43 could mate with the plurality of LED lights accurately, thereby improving the accuracy of sample preparation.

The above is only the implementation method of this application, rather than restricting the patent scope of this application. Any equivalent structure or equivalent process transformation made by using the contents of this application specification and attached drawings, or directly or indirectly used in other related technical fields, shall be included in the patent protection scope of this application.

What is claimed is:

1. A backlight module, comprising:
   a substrate,
   a backlight source, arranged on the substrate; and
   a silicone film, coated on a light emitting surface of the backlight source;
   wherein a cross-section of the silicone film along a direction substantially perpendicular to the substrate is an arc to diffuse light emitted by the backlight source;
   wherein the silicone film is a silicone layer containing fluorescent powder or quantum dots;
   wherein the backlight source comprises a plurality of LED lights distributed in array, and the light emitting surface of each of the plurality of LED lights is coated with the silicone film;
   wherein each of the plurality of LED lights is a blue LED light, both a length and a width of each of the plurality of LED lights are about 100-1000 μm, and a spacing between adjacent LED lights is about 100-2000 μm.

2. The backlight module according to claim 1, wherein the backlight source comprises a plurality of LED lights distributed in array, and the light emitting surface of each of the plurality of LED lights is coated with the silicone film.

3. The backlight module according to claim 1, wherein the cross-section of the silicone film along the direction substantially perpendicular to the substrate is an arc curve, a double arc curve or a multi-arc curve.

4. The backlight module according to claim 1, further comprising:
   a diffusion film, arranged on a side of the silicone film away from the backlight source and spaced apart from the silicone film; and
   a brightness enhancement film, arranged on a side of diffusion film away from the silicone film and adjacent to the diffusion film.

5. The backlight module according to claim 1, wherein the silicone film is formed by means of a steel mesh mask.

6. A display device, comprising a backlight module, the backlight module comprises:
   a substrate;
   a backlight source, arranged on the substrate; and
   a silicone film, coated on a light emitting surface of the backlight source;
   wherein a cross-section of the silicone film along a direction substantially perpendicular to the substrate is an arc to diffuse light emitted by the backlight source;
   wherein the silicone film is a silicone layer containing fluorescent powder or quantum dots;
   wherein the backlight source comprises a plurality of LED lights distributed in array, and the light emitting surface of each of the plurality of LED lights is coated with the silicone film;
   wherein each of the plurality of LED lights is a blue LED light, both a length and a width of each of the plurality of LED lights are about 100-1000 μm, and a spacing between adjacent LED lights is about 100-2000 μm.

7. The display device according to claim 6, wherein the backlight source comprises a plurality of LED lights distributed in array, and the light emitting surface of each of the plurality of LED lights is coated with the silicone film.

8. The display device according to claim 6, wherein the cross-section of the silicone film along the direction substantially perpendicular to the substrate is an arc curve, a double arc curve or a multi-arc curve.

9. The display device according to claim 6, wherein the backlight module further comprises:
   a diffusion film, arranged on a side of the silicone film away from the backlight source and spaced apart from the silicone film; and
   a brightness enhancement film, arranged on a side of diffusion film away from the silicone film and adjacent to the diffusion film.

10. The display device according to claim 6, wherein the silicone film is formed by means of a steel mesh mask.

11. A manufacturing method of a backlight module, comprising:
   providing a substrate;
   arranging a backlight source on a side of the substrate;
   forming a silicone film on a light emitting surface of the backlight source, wherein a cross-section of the silicone film along a direction substantially perpendicular to the substrate is an arc to diffuse light emitted by the backlight source;
   wherein the arranging a backlight source on a side of the substrate further comprises:
      arranging a plurality of LED lights on the substrate in array;
   the forming a silicone film on a light emitting surface of the backlight source further comprises:
      coating or printing liquid silicone in a plurality of through holes of a steel mesh mask after aligning centers of the plurality of through holes with centers of the plurality of LED lights by positioning marks, wherein the liquid silicone contains fluorescent powder or quantum dots;
      removing the steel mesh mask, shaping the liquid silicone by heating and curing the liquid silicone by cooling to form the silicone film, such that the silicone film coats the LED lights.

12. The manufacturing method according to claim 11, wherein the cross-section of the silicone film along the direction substantially perpendicular to the substrate is an arc curve, a double arc curve or a multi-arc curve.

13. The manufacturing method according to claim 11, wherein each of the LED lights is a blue LED light, both a length and a width of each of the LED light are about 100-1000 μm, and a spacing between adjacent LED lights is 100-2000 μm.

* * * * *